(12) United States Patent
Ganapathisubramanian et al.

(10) Patent No.: US 9,164,375 B2
(45) Date of Patent: Oct. 20, 2015

(54) DUAL ZONE TEMPLATE CHUCK

(75) Inventors: Mahadevan Ganapathisubramanian, Cedar Park, TX (US); Byung-Jin Choi, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 622 days.

(21) Appl. No.: 12/817,787

(22) Filed: Jun. 17, 2010

(65) Prior Publication Data

US 2010/0320645 A1    Dec. 23, 2010

Related U.S. Application Data

(60) Provisional application No. 61/218,686, filed on Jun. 19, 2009.

(51) Int. Cl.
| | | |
|---|---|---|
| *G03F 7/00* | (2006.01) | |
| *B82Y 10/00* | (2011.01) | |
| *B82Y 40/00* | (2011.01) | |

(52) U.S. Cl.
CPC ............. *G03F 7/0002* (2013.01); *B82Y 10/00* (2013.01); *B82Y 40/00* (2013.01); *Y10T 279/17* (2015.01)

(58) Field of Classification Search
CPC .................................................... G03F 7/0002
USPC ........................................................ 264/293
See application file for complete search history.

(56) References Cited

U.S. PATENT DOCUMENTS

| | | |
|---|---|---|
| 6,696,220 B2 | 2/2004 | Bailey et al. |
| 6,873,087 B1 | 3/2005 | Choi et al. |
| 6,922,906 B2 | 8/2005 | Choi et al. |
| 6,951,173 B1 | 10/2005 | Meissl et al. |
| 6,955,868 B2 | 10/2005 | Choi et al. |
| 7,098,572 B2 | 8/2006 | Choi et al. |
| 7,150,622 B2 | 12/2006 | Choi et al. |
| 7,670,530 B2 | 3/2010 | Choi et al. |
| 7,708,542 B2 | 5/2010 | Bailey et al. |
| 7,768,624 B2 | 8/2010 | Cherala et al. |
| 2002/0150398 A1 | 10/2002 | Choi et al. |
| 2004/0090611 A1 | 5/2004 | Choi et al. |
| 2004/0149687 A1 | 8/2004 | Choi et al. |
| 2004/0197712 A1 | 10/2004 | Jacobson et al. |
| 2005/0260295 A1 | 11/2005 | Choi et al. |
| 2005/0264132 A1 | 12/2005 | Choi et al. |
| 2005/0274219 A1 | 12/2005 | Choi et al. |
| 2005/0275251 A1 | 12/2005 | Choi et al. |
| 2005/0275311 A1 | 12/2005 | Choi et al. |
| 2006/0005657 A1 | 1/2006 | Choi et al. |
| 2007/0114686 A1* | 5/2007 | Choi et al. ............... 264/2.7 |
| 2007/0228589 A1* | 10/2007 | Choi et al. ............... 264/39 |
| 2008/0223237 A1* | 9/2008 | Ando et al. ............... 101/333 |

(Continued)

FOREIGN PATENT DOCUMENTS

| | | |
|---|---|---|
| EP | 1830351 | 9/2007 |
| WO | WO/97/05608 | 2/1997 |

(Continued)

*Primary Examiner* — Larry Thrower
(74) *Attorney, Agent, or Firm* — Cameron A. King

(57) ABSTRACT

A template chuck includes multiple zones to provide 1) an imprint bend optimized to provide high curvature and provide contact at middle radius of substrate and/or, 2) separation bend zone with an increased free span zone and high crack angle.

11 Claims, 6 Drawing Sheets

(56) References Cited

U.S. PATENT DOCUMENTS

2009/0026657 A1 1/2009 Nimmakayala et al.
2009/0037004 A1 2/2009 Choi et al.

FOREIGN PATENT DOCUMENTS

| WO | WO/2007/136832 | 11/2007 |
| WO | WO/2010/047788 | 4/2010 |

* cited by examiner

DUAL ZONE TEMPLATE CHUCK

CROSS-REFERENCE TO RELATED APPLICATION

The present application claims priority to U.S. Provisional Application No. 61/218,686, filed on Jun. 19, 2009, which is hereby incorporated by reference in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
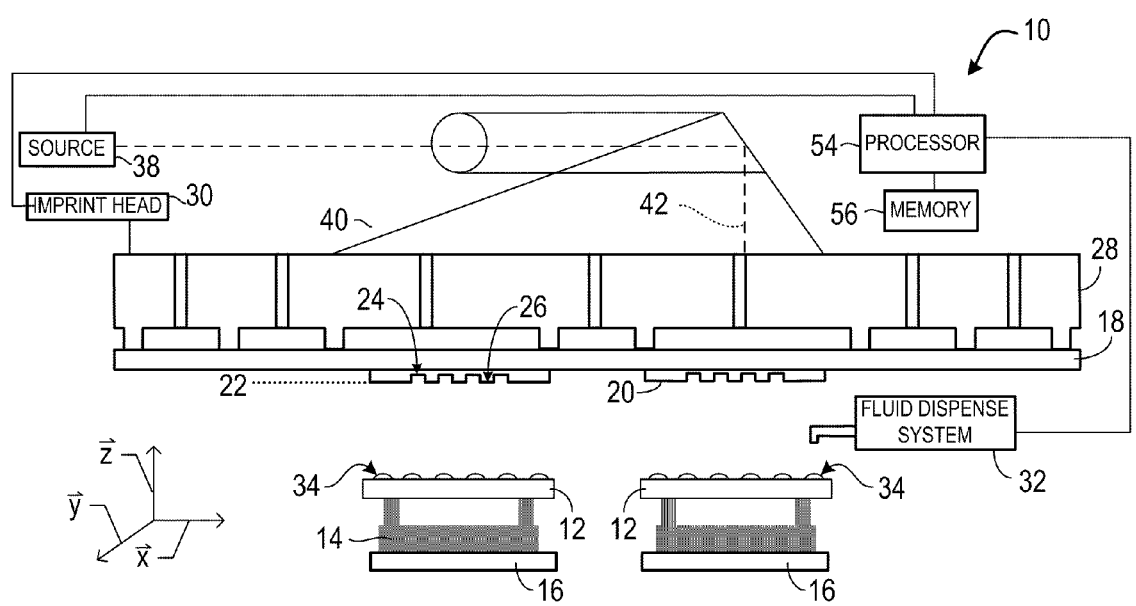
FIG. 1 illustrates a simplified side view of a lithographic system including a prior art chucking system.
Figure 2:
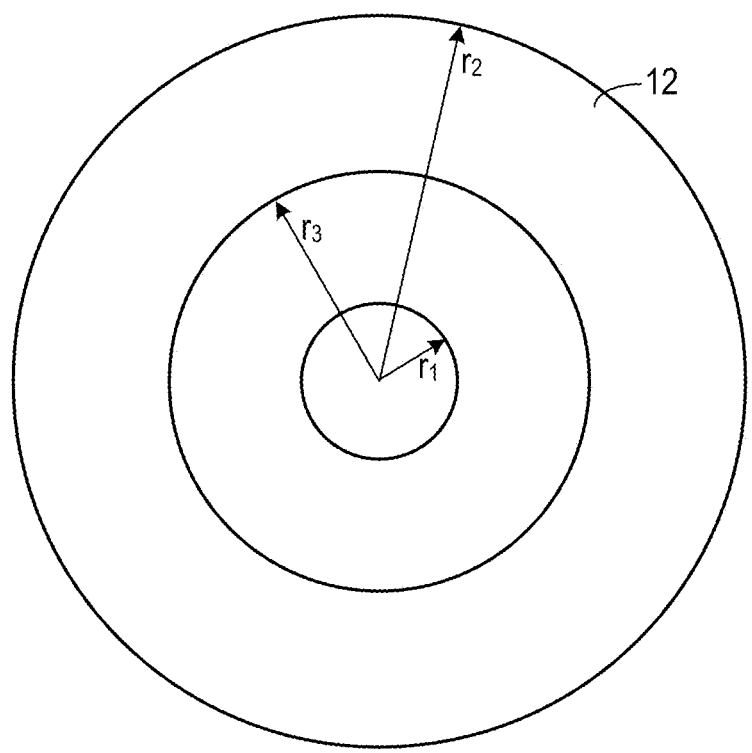
FIG. 2 illustrates a top down view of a substrate.

Referring to the figures, and particularly to FIGS. 1 and 2, illustrated therein is a lithographic system 10 used to form a relief pattern on substrate 12. Substrate 12 may have a circular shape; however, it should be noted substrate 12 may have any geometric shape. For example, substrate 12 may have a disk shape having an inner radius $r_1$ and an outer radius $r_2$, with radius $r_1$ being less than outer radius $r_2$. Further defined between inner radius $r_1$ and outer radius $r_2$ may be a middle radius $r_3$. Middle radius $r_3$ may be positioned substantially equidistant from inner radius $r_1$ and outer radius $r_2$.

Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, both of which are hereby incorporated by reference herein.

Figure 3:
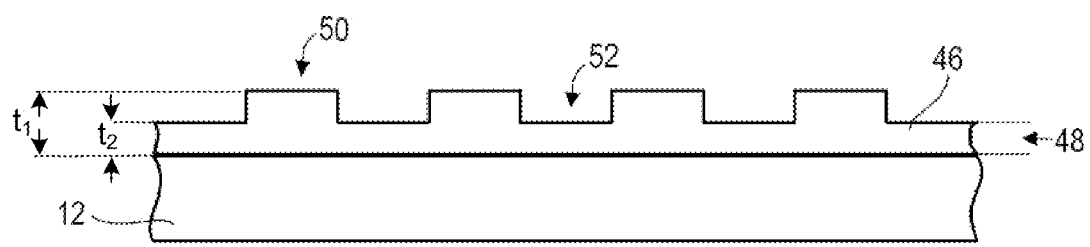
FIG. 3 illustrates a simplified side view of the substrate shown in FIG. 1 having a patterned layer positioned thereon.

Referring to FIGS. 1 and 3, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference herein.

As mentioned above, a distance between mold 20 and substrate 12 may be varied such that a desired volume may be defined therebetween with the desired volume capable of being filled with polymerizable material 34. Furthermore, after solidification, polymerizable material 34 may conform to the shape of the surface of substrate 12 to define patterned layer 46. In the volume defined between droplets of polymerizable material 34 on substrate 12, there may be gases present, and as such, droplets of polymerizable material 34 are generally spread over substrate 12 so as to avoid, if not prevent, trapping of gases and/or gas pockets in the volume between substrate 12 and mold 20. Gas and/or gas pockets may result in pattern distortion of features formed in patterned layer 46, low fidelity of features formed in patterned layer 46, and/or non-uniform thickness $t_2$ of residual layer 48.

Figure 4:
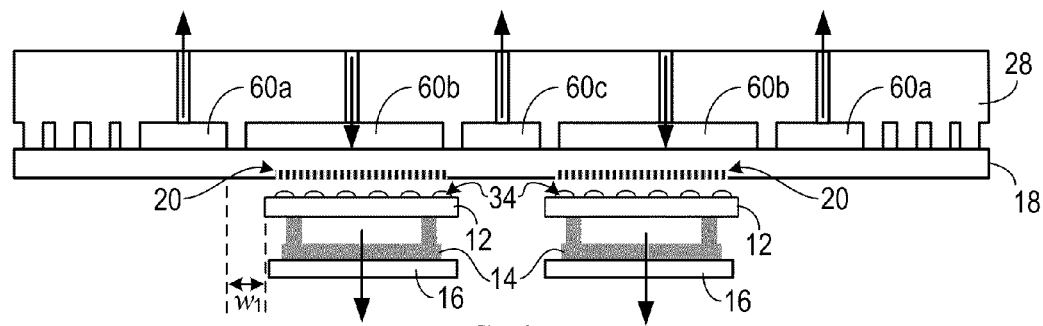
FIG. 4 illustrates a simplified side view of the prior art chucking system illustrated in FIG. 1.

Toroidal imprinting of substrate 12 may provide a method of expelling gas between substrate 12 and mold 20. For example, FIGS. 1 and 4 illustrate a prior art embodiment of chuck 28 capable of altering the shape of template 18. Chuck 28 is further described in U.S. patent application Ser. No. 11/749,909, which is hereby incorporated by reference herein in its entirety. The shape of template 18 may be altered by chuck 28 such that the distance defined between mold 20 and substrate 12 at middle radius $r_3$ of substrate 12 (shown in FIG. 2) may be less than the distance defined between mold and substrate at remaining portions of mold 20. For example, by controlling pressure within chambers 60a-60c of chuck 28, portions of template 18 may bow away from substrate 12 while other portions of template 18 may bow toward substrate 12. In one example, pressure may be controlled by pressurizing chamber 60b and providing vacuum force in chambers 60a and 60c. By controlling pressure to bow template 18, a portion of mold 20 (e.g., portion in superimposition with middle radius $r_3$ of substrate 12) contacts a sub-portion of droplets of polymerizable material 34 deposited on substrate 12. This may cause droplets to spread and may provide a contiguous film of polymerizable material 34.

The edge of the contiguous film may define a liquid-gas interface functioning to push gases toward the edge of substrate 12. Volume between droplets of polymerizable material 34 define gas passages through which gas may be pushed to the edge of substrate 12. As a result, the liquid-gas interface in conjunction with the gas passages may minimize, if not prevent, trapping of gases in the contiguous film.

Referring to FIGS. 2 and 4, to control the initial contact of mold 20 at middle radius $r_3$ and maintain a constant fluid front velocity toward the inner radius $r_1$ and outer radius $r_2$, generally pressure control within chuck 28 may need to be sized and located such that deflection of template 18 is symmetric about middle radius $r_3$. This may reduce the free span length $w_1$ of template 18. Free span length $w_1$ may be defined as the length of template 18 unsupported by chuck 28 and substrate 12 (i.e. distance between the last constraint of template 18 on chuck 28 and edge of patterned layer 46 on substrate 12). A reduced free span length $w_1$ may increase the separation force, which is generally undesirable.

Figure 5:
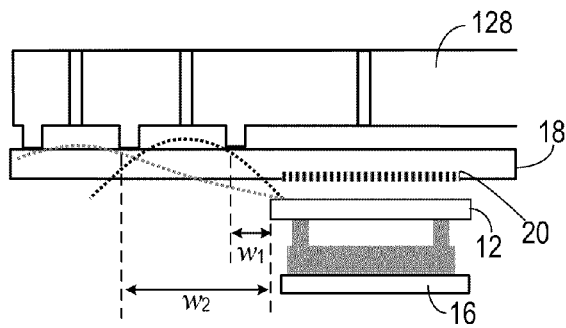
FIG. 5 illustrates a chucking system in accordance with an embodiment of the present invention having multiple free span zones.
Figure 6:
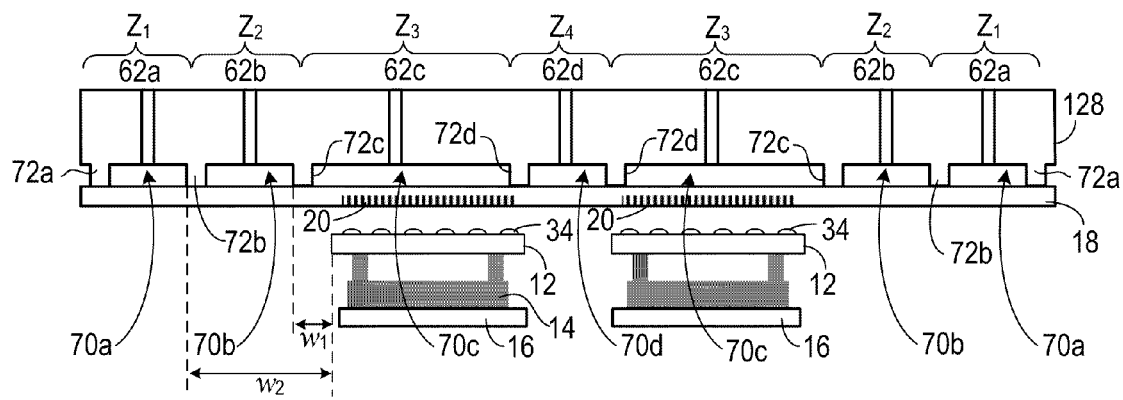
FIG. 6 illustrates a chucking system in accordance with an embodiment of the present invention.

FIGS. 5 and 6 illustrate a chuck 128 in accordance with the present invention. Chuck 128 provides for a second free span length $w_2$ prior to separation that is different from the first free span length $w_1$ during imprinting (needed to maintain middle radius $r_3$ contact and substantially uniform fluid front control). For example, as illustrated in FIG. 5, the magnitude of second free span length $w_2$ may be larger than first free span length $w_1$. The larger free span length prior to separation may reduce the magnitude of force needed to separate template 18 from substrate 12.

Chuck 128 may include first 66 and second 68 sides. First side 66 may include recesses 70a-70d and supports 72a-72d. Chambers 62a-62d may be defined by recesses 70a-70d and positioning of template 18 on supports 72a-72d as illustrated in FIG. 6. For example, recesses 70a, supports 72a and 72b, and a portion of template 18 define chamber 62a. Recesses 70b and another portion of template 18 define chamber 62b. Generally, chambers 62a-62d provide four distinct zones, a separation outer bend zone $Z_1$, an imprint outer bend zone $Z_2$, a back pressure zone $Z_3$, and an inner bend zone $Z_4$. The separation outer bend zone $Z_1$ cinctures the imprint outer bend zone $Z_2$, which cinctures the back pressure zone $Z_3$, which cinctures the inner bend zone $Z_4$.

In one embodiment, dimensions of inner bend zone $Z_4$, back pressure zone $Z_3$ and outer bend zone $Z_2$ may be substantially similar to dimensions of prior art chucks such as those described in U.S. patent application Ser. No. 11/749,909, which is hereby incorporated by reference herein in its entirety. In contrast, separation outer bend zone $Z_1$ may be configured with an increased diameter as compared to outer zones of prior art chucks to provide second free span length $w_2$ during separation. Second free span length $w_2$ may be approximately three times free span length $w_1$. For example, free span length $w_1$ is generally about 2.5 mm. Separation outer bend zone $Z_1$ may be configured with an increased diameter as compared to outer zones of prior art chucks to provide second free span length $w_2$ during separation of about 14 mm.

In one example, inner bend zone $Z_4$ may have a diameter of approximately 18 mm. Back pressure zone $Z_3$ may extend from approximately 19 mm to approximately 67 mm. Imprint bend zone $Z_2$ may extend from approximately 68 mm to approximately 90 mm, and separation bend zone $Z_1$ may extend from approximately 91 mm to approximately 117 mm. It should be noted that extension of separation outer bend zone $Z_1$ and dimensions of zones $Z_{1-3}$ may be determined based on size and configuration of template 18.

A pump system may operate to control pressure within each zone $Z_1$-$Z_4$. Pump system may be in fluid communication with throughways. In one embodiment, a single pump system may operate to control pressure within each zone $Z_1$-$Z_4$. Alternatively, two or more pump systems may operate to control pressure within each zone $Z_1$-$Z_4$. Pressure may include application of pressure (i.e., pressure state) within zones $Z_1$-$Z_4$ and/or application of vacuum force (i.e., vacuum state) within zones $Z_1$-$Z_4$. Generally, pressure state may be between approximately 0 to 10 kPa and vacuum state may be between approximately 0 to −90 kPa.

Figure 7:
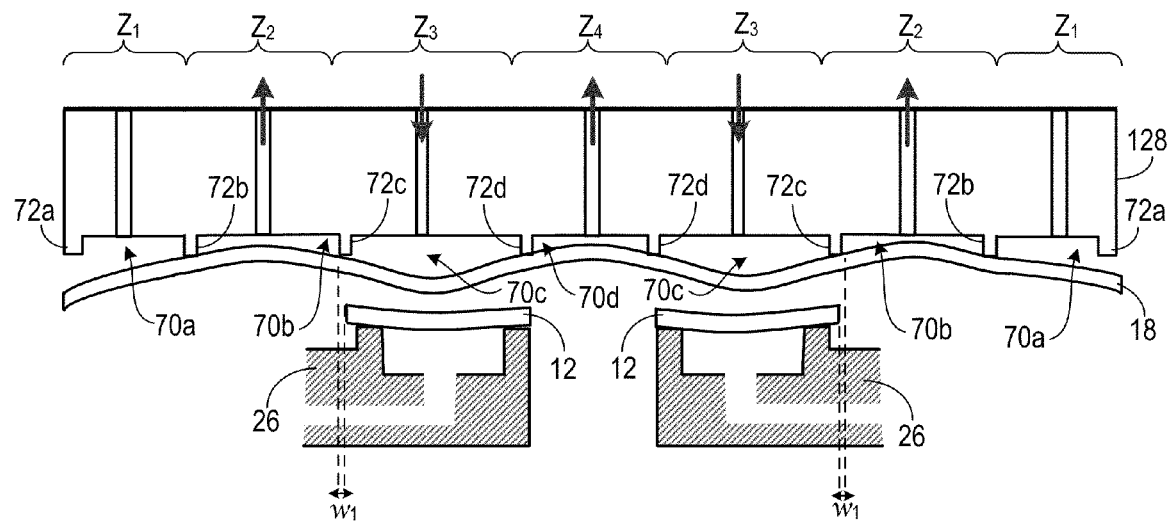
FIG. 7 illustrates the chucking system of FIG. 6 prior to imprinting.

FIG. 7 illustrates use of chuck 128 prior to imprinting. Prior to imprinting, pump system may provide imprint outer bend zone $Z_2$ and inner bend zone $Z_4$ in a vacuum state. Vacuum state of outer bend zone $Z_2$ and inner bend zone $Z_4$ may be substantially similar. Alternatively, magnitude of vacuum state of outer bend zone $Z_2$ may be increased as compared to inner bend zone $Z_4$ or magnitude of vacuum state of outer bend zone $Z_3$ may be decreased as compared to inner bend zone $Z_4$.

Prior to imprinting, back pressure zone $Z_3$ may be provided in a pressure state. Having outer bend zone $Z_2$ and inner bend zone $Z_4$ in a vacuum state and back pressure zone $Z_3$ in a pressure state provides template 18 in a toroidal imprint shape as illustrated in FIG. 7. The toroidal imprint shape provides template 18 with a first free span length $w_1$. Magnitude of free span length $w_1$ may be between approximately 1.5 mm-4 mm. For example, magnitude of free span length $w_1$ may be 2.5 mm.

Prior to and/or during imprinting, separation outer bend zone $Z_1$ may be deactivated in an open and/or blocked state. FIG. 6 illustrates separation outer bend zone $Z_1$ in a blocked state wherein no pressure or vacuum is applied to chamber 70a by pump system. FIG. 7 illustrates separation outer bend zone $Z_1$ in an open state wherein chamber 70a is open in that template 18 only contacts support 72b. Alternatively, separation outer bend zone $Z_1$ may be provided in a pressure state, however, at significantly a lower pressure state as compared to back pressure zone $Z_3$, or separation outer bend zone $Z_1$ may be provided in a vacuum state that is significantly lower than imprint outer bend zone $Z_2$ and/or inner bend zone $Z_4$.

Figure 8:
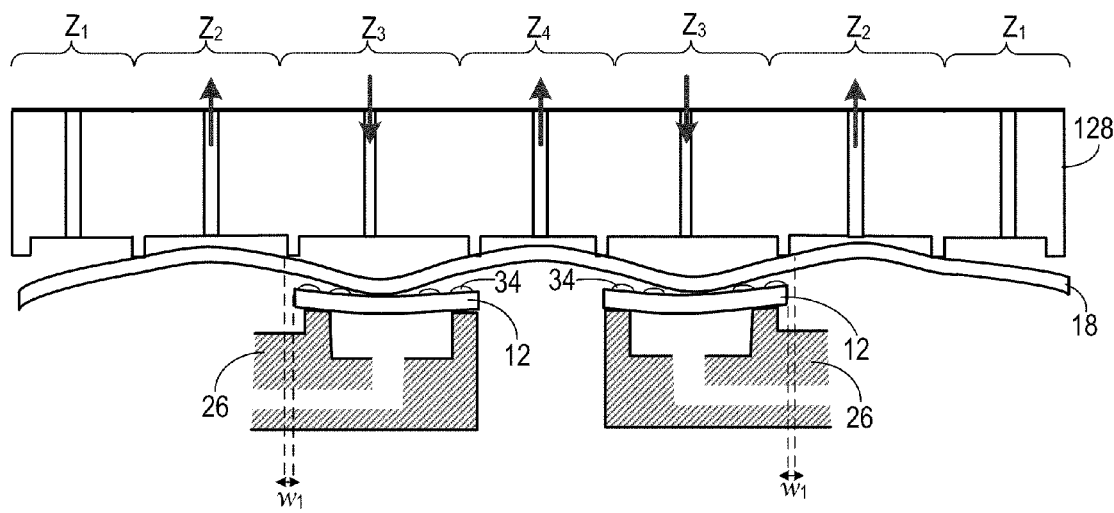
FIG. 8 illustrates the chucking system of FIG. 6 during imprinting.

Referring to FIGS. 2 and 8, the toroidal imprint shape created prior to imprinting may provide deflection of template 18 symmetric about middle radius $r_3$ of substrate 12 during imprinting. Vacuum state and positioning of imprint outer bend zone $Z_2$ and inner bend zone $Z_4$ (e.g., about the middle radius $r_3$) may be configured to provide a radius of curvature at the interface of substrate 12 and template 18 that accelerates filling of polymerizable material 34. Radius of curvature may be on the order of 800 mm to 8000 mm.

Figure 9:
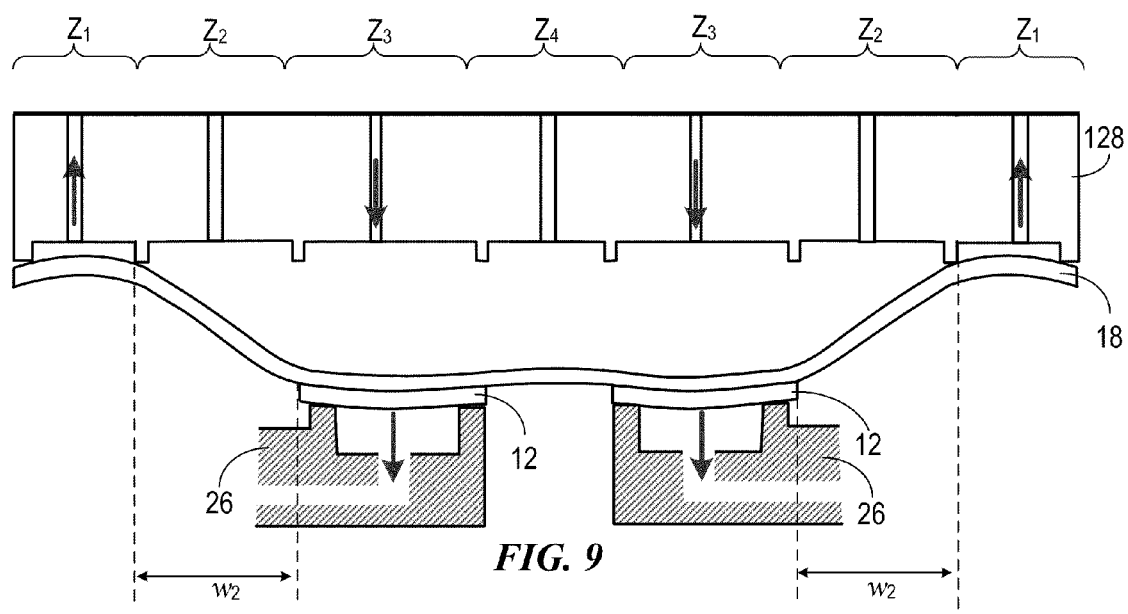
FIG. 9 illustrates the chucking system of FIG. 6 prior to separation.

Referring to FIG. 9, during separation of template 18 and substrate 12 (e.g., patterned layer 46 shown in FIG. 2), separation outer bend zone $Z_1$ and back pressure zone $Z_3$ may be activated and imprint outer bend zone $Z_2$ and the inner bend zone $Z_4$ may be deactivated providing template 18 with a single wave having free span length $w_2$. For example, separation outer bend zone $Z_1$ may be activated to be in a vacuum state and back pressure zone $Z_3$ may be activated to be in a pressure state while imprint outer bend zone $Z_2$ and the inner bend zone $Z_4$ may be deactivated in a blocked state. Alternatively, imprint outer bend zone $Z_2$ and/or inner bend zone $Z_4$ may be activated in a minimal pressure state.

Activation of separation outer bend zone $Z_1$ and back pressure zone $Z_3$ with minimal or no interaction with imprint outer bend zone $Z_2$ and the inner bend zone $Z_4$ alters the first free span length $w_1$ to a second free span length $w_2$. An increase from the first free span length $w_1$ to the second free span length $w_2$ minimizes separation force. The increase in free span length $w_2$ may amplify an upward separation force generally provided during separation of template 18 and substrate 12, and as such, may provide a larger crack angle for the same upward force as compared to free span length $w_1$. This may reduce the force needed to separate template 18 from substrate 12. For example, first free span length $w_1$ of approximately 2.5 mm may provide a crack angle of approximately 0.8 mrad. Providing second free span length $w_2$ of approximately 14 mm may provide a crack angle of approximately 3.1 mrad. For chuck 128, crack angle may thus be greater than approximately 1.5 mrad reducing separation force by greater than approximately 40% as compared to providing free span length $w_1$ during separation.

In one embodiment, as illustrated in FIG. 9, in addition to the increase from the first free span length $w_1$ to the second free span length $w_2$, vacuum state of substrate chuck 26 may be increased during separation. Generally, substrate chuck 26 is always in a vacuum state (e.g., −5 kPa) in order to hold substrate 12 during imprinting. Increasing vacuum state of substrate chuck 26 during separation may aid in retaining substrate 12 during separation. For example, vacuum state may be increased to approximately −20 kPa during separation.

Figure 10:
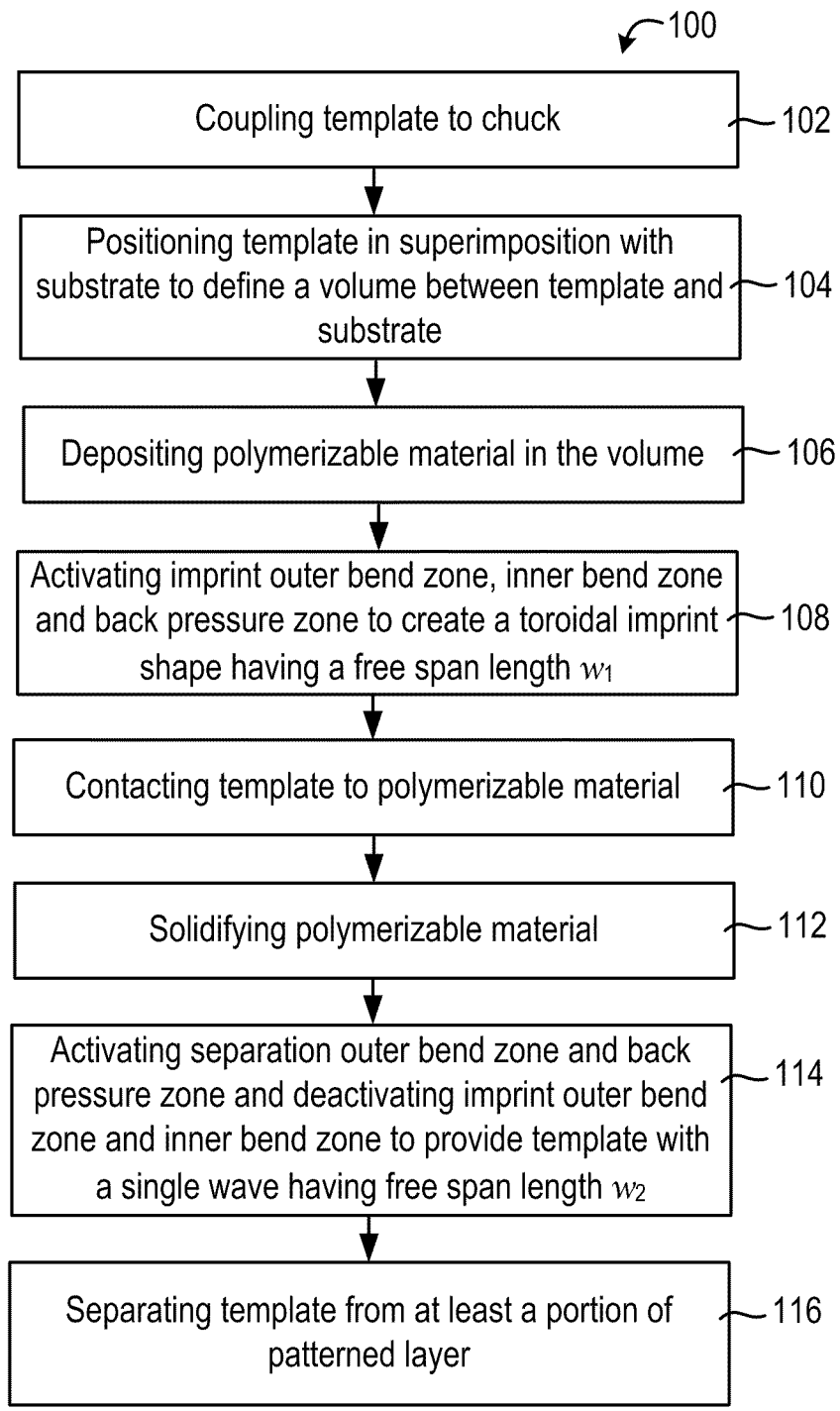
FIG. 10 illustrates a flow chart of a method for imprinting polymerizable material on a substrate in accordance with an embodiment of the present invention.

FIG. 10 illustrates a flow chart for a method 100 for imprinting polymerizable material 34 on substrate 12. In a step 102, template 18 may be coupled to chuck 28b. In a step 104, template 18 may be positioned in superimposition with substrate 12 defining a volume between template 18 and substrate 12. In a step 106, polymerizable material 34 may be deposited in the volume defined between template 18 and substrate 12. In a step 108, pump system may activate imprint outer bend zone $Z_2$, inner bend zone $Z_4$, and back pressure zone $Z_3$ creating a toroidal imprint shape having free span length $w_1$. For example, pump system may provide imprint outer bend zone $Z_2$ and inner bend zone $Z_4$ in a vacuum state and back pressure zone $Z_3$ in a pressure state. In a step 110, template 18 may contact polymerizable material 34. In a step 112, polymerizable material may be solidified. In a step 114, pump system may activate separation outer bend zone $Z_1$ and back pressure zone $Z_3$, and deactivate imprint outer bend zone $Z_2$ and the inner bend zone $Z_4$ to provide template 18 with a single wave having free span length $w_2$. For example, pump system may provide separation outer bend zone $Z_1$ in a vacuum state and back pressure zone $Z_3$ in a pressure state while outer bend zone $Z_2$ and the inner bend zone $Z_4$ are deactivated (e.g. blocked). In addition, pump system may increase vacuum state of substrate chuck 26. For example, pump system may increase vacuum state of substrate chuck 26 from approximately −5 kPa to approximately −20 kPa. In a step 116, template 18 may be separated from at least a portion of patterned layer 46. In one example, template 18 may be completely separated from the patterned layer 46.

What is claimed is:

1. A nano-imprint lithography method, comprising:
imprinting polymerizable material positioned on a substrate by contacting the polymerizable material with a template to form a patterned layer on the substrate, the template coupled to a chuck and constrained against first and second template supports of the chuck, the first and second template supports defining an imprint outer bend zone, the first template support provided at a first distance from an edge of the patterned layer, the first distance defining a first free span length along the template;
prior to separating the template from the patterned layer and while the template remains in contact with the patterned layer, adjusting the chuck to constrain the template against the second template support and a third template support of the chuck and releasing the constraint against the first support, the second and third supports defining a separation outer bend zone that cinctures the imprint outer bend zone, with the second template support provided at a second distance from an edge of the patterned layer, the second distance defining a second free span length along the template and wherein the first free span length is less than the second free span length; and separating the template and the patterned layer.

2. The nano-imprint lithography method of claim 1, wherein the second free span length is configured to reduce the magnitude of force needed to separate the template from the patterned layer.

3. The nano-imprint lithography method of claim 1, wherein the chuck includes four zones: the separation outer bend zone, the imprint outer bend zone, a back pressure zone, and an inner bend zone, the separation outer bend zone cincturing the imprint outer bend zone which cinctures the back pressure zone which cinctures the inner bend zone.

4. The nano-imprint lithography method of claim 3, wherein a pump system controls pressure within each zone during the imprinting step and the separation step.

5. The nano-imprint lithography method of claim 4, wherein prior to imprinting, the pump system provides the imprint outer bend zone and the inner bend zone in a vacuum state, and the back pressure zone in a pressure state, such that template forms a toroidal imprint shape having the first free span length.

6. The nano-imprint lithography method of claim 5, wherein the toroidal imprint shape provides deflection of the template symmetric about a middle radius of the substrate during imprinting.

7. The nano-imprint lithography method of claim 5, wherein the imprint outer bend zone and inner bend zone are configured to provide a radius of curvature at an interface of the substrate and the template that accelerates filling of polymerizable material between the substrate and the template during the imprinting step.

8. The nano-imprint lithography method of claim 5, wherein prior to imprinting, the separation outer bend zone is deactivated.

9. The nano-imprint lithography method of claim 4, wherein during separation of the template and the patterned layer, the pump system provides the separation outer bend zone in a vacuum state and the back pressure zone in a pressure state such that the template has the second free span length.

10. The nano-imprint lithography method of claim 9, wherein during separation of the template and the patterned layer, the imprint outer bend zone and the inner bend zone is deactivated.

11. The nano-imprint lithography method of claim 1, wherein the substrate is coupled to a substrate chuck, and during the separation step, the substrate chuck is in a vacuum state.

* * * * *